(12) United States Patent
Ramer et al.

(10) Patent No.: US 10,873,175 B2
(45) Date of Patent: Dec. 22, 2020

(54) LIGHT FREQUENCY UP-CONVERSION OF LASER LIGHT, FOR PRODUCING GREEN OR YELLOW LIGHT

(71) Applicant: ABL IP HOLDING LLC, Conyers, GA (US)

(72) Inventors: David P. Ramer, Reston, VA (US); Guan-Bo Lin, Reston, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 0 days.

(21) Appl. No.: 16/259,225

(22) Filed: Jan. 28, 2019

(65) Prior Publication Data

US 2020/0244044 A1 Jul. 30, 2020

(51) Int. Cl.
*H01S 5/40* (2006.01)
*H01S 5/00* (2006.01)
*H01S 5/42* (2006.01)
*F21K 9/61* (2016.01)
*F21K 9/64* (2016.01)

(52) U.S. Cl.
CPC .............. *H01S 5/4087* (2013.01); *F21K 9/61* (2016.08); *F21K 9/64* (2016.08); *H01S 5/0071* (2013.01); *H01S 5/0092* (2013.01); *H01S 5/423* (2013.01)

(58) Field of Classification Search
CPC ....... H01S 5/4087–4093; H01S 5/0092; H01S 5/42–423; G02F 1/3532; G02F 1/353–3538; G02F 2001/354; G02F 2001/3542; G02F 1/3544; G02F 2001/3546; G02F 2001/3548; G02F 1/37; G02F 2001/372; G02F 2001/374; G02F 1/377; G02F 1/3775; G02F 1/383;
(Continued)

(56) References Cited

U.S. PATENT DOCUMENTS 5,535,230 A * 7/1996 Abe .......................... F21K 9/69
250/504 R
5,802,222 A * 9/1998 Rasch .................. H04N 9/3129
385/1
(Continued)

OTHER PUBLICATIONS

United Crystals, "Non-linear Optical Crystal Overview," https://unitedcrystals.com/NLOCOverview.html, © 2016 United Crystals, dated Aug. 7, 2018, 2 pages.
(Continued)

*Primary Examiner* — Joshua King
(74) *Attorney, Agent, or Firm* — RatnerPrestia

(57) ABSTRACT

To improve efficiency, particularly for general illumination applications, a source of green or yellow light includes a solid state device (e.g. a laser diode) to produce an infrared laser beam and a light frequency up-converter to convert the infrared light into green or yellow light. A luminaire includes such a source as well as a source providing two other colors of light, such as red and blue (e.g. not green or yellow). The emitters of the other source may be light emitting diodes or additional laser diodes. The luminaire outputs a combination of the various colors of lights from the sources, for example, to produce white light. If the different emitters are independently controllable, the luminaire may be adjusted or 'tuned' to output white light of different color characteristics and/or to output combined light of various colors over a wide region of the visible light color gamut.

16 Claims, 6 Drawing Sheets

(58) Field of Classification Search
CPC ......... G02F 1/39–397; G02F 2001/392; F21K 9/61; F21K 9/64
See application file for complete search history.

(56) References Cited

U.S. PATENT DOCUMENTS

| | | | |
|---|---|---|---|
| 6,393,038 B1 | 5/2002 | Raymond et al. | |
| 6,480,325 B1* | 11/2002 | Batchko | G02F 1/3532 359/326 |
| 6,736,517 B2* | 5/2004 | Sherman | H04N 9/3129 348/744 |
| 7,986,315 B2* | 7/2011 | Sprague | G02B 27/104 345/204 |
| 9,136,673 B2* | 9/2015 | Holder | H01S 5/18358 |
| 2004/0217364 A1* | 11/2004 | Tarsa | H01L 25/0753 257/89 |
| 2005/0152421 A1* | 7/2005 | Fujitani | F21K 9/68 372/43.01 |
| 2006/0131695 A1* | 6/2006 | Kuekes | B82Y 30/00 257/618 |
| 2008/0180786 A1* | 7/2008 | Bratkovski | G02F 1/37 359/328 |
| 2011/0021970 A1 | 1/2011 | Vo-Dinh et al. | |
| 2012/0106127 A1* | 5/2012 | Hattori | F21V 9/38 362/84 |
| 2013/0177775 A1 | 7/2013 | Cheah et al. | |
| 2013/0329448 A1* | 12/2013 | Franz | F21K 9/64 362/555 |
| 2014/0105784 A1 | 4/2014 | Smeeton et al. | |
| 2014/0341241 A1* | 11/2014 | Essaian | H01S 5/4093 372/34 |
| 2014/0353696 A1* | 12/2014 | Kinoshita | A61B 1/0684 257/89 |
| 2015/0085347 A1* | 3/2015 | Choi | G02B 1/002 359/326 |
| 2016/0030610 A1 | 2/2016 | Peterson et al. | |
| 2018/0066810 A1* | 3/2018 | Lentine | G02B 27/30 |

OTHER PUBLICATIONS

James Johnson, "Selection of Materials for UV Optics," Dec. 1, 2008, OPTI 521, pp. 1-6.
United Crystals, "Properties of KDP, DKDP and ADP Crystal," https://unitedcrystals.com/KDPProp.html, © 2016 United Crystals, dated Jul. 16, 2018, 2 pages.
Kavita Devi et al., "Tunable, continuous-wave, ultraviolet source based on intracavity sum-frequency-generation in an optical parametric oscillator using BiB3O6", © 2013 Optical Society of America, Oct. 12, 2013, vol. 21, No. 21, Optic Express pp. 24829-24836, 8 pages.
Wikipedia, "Sum-frequency generation," https://en.wikipedia.org/wiki/Sum-frequency_generation, dated Jul. 16, 2018, 2 pages.
Wikipedia, "Optical frequency multiplier," https://en.wikipedia.org/wiki/Optical_frequency_multiplier, dated Jul. 16, 2018, 1 page.
Wikipedia, "Acousto-optic Modulator," https://en.wikipedia.org/wiki/Acousto-optic_modulator, dated Aug. 8, 2018, 4 pages.
Brimrose Corp., "Free Space Acousto-Optic Modulators," https://www.brimrose.com/acousto-optic-modulators, dated Aug. 8, 2018, 6 pages.
Wikipedia, "Second-harmonic generation," https://en.wikipedia.org/wiki/Second-harmonic_generation, dated Jul. 16, 2018, 10 pages.
Guoqiang Shi, et al., "Finding the Next Deep-Ultraviolet Nonlinear Optical Material: NH4B4O6F," ACS Publications, © American Chemical Society, J. Am. chem. Soc. 2017, 139, pp. 10645-10648, 4 pages.
Zhi Fang, et al., "Deep-Ultraviolet Nonlinear Optical Crystal Cs2Al2(B3O6)2O: A Benign Member of the Sr2Be2(BO3) 2O Family with [Al2(B3O6)2O]2—Double Layers," Chem. Eur. J. 10.1002/chem.201801742, first published Apr. 15, 2018, 8 pages, https://doi.org/10.1002/chem.201801742.
Min Luo, et al., "M2B10O14F6 (M=Ca, Sr): The First Two Noncentrosymmetric Alkaline-Earth Fluorooxoborates as Promising Next-Generation Deep-Ultraviolet Nonlinear Optical Materials," J. Am. Chem. Soc., Just Accepted Manuscript, DOI: 10.1021/jacs.8b01263, publication date Mar. 8, 2018, downloaded from http://pubs.acs.org on Mar. 8, 2018, ACS Publications, © American Chemical Society, 6 pages.
Sunil Mittal et al., "Topological Photonic Systems," May 2018, Optics & Photonics News, pp. 37-43, 7 pages.
Behrooz Semnani, et al., "Graphene-Integrated Plasmonic Structure for Optical Third Harmonic Generation," IEEE Journal of Selected Topics in Quantum Electronics, vol. 23, No. 1, Jan./Feb. 2017, 12 pages.
Nils Weber et al., "Double resonant plasmonic nanoantennas for efficient second harmonic generation in zinc oxide," Physical Review B 95, 205307 (2017) © 2017 American Physical Society, 6 pages.
Sheng Liu et al., "Resonantly Enhanced Second-Harmonic Generation Using III-V Semiconductor All-dielectric metasurfaces," Nano Letters 2016, 16(9) pp. 5426-5432, Publication Date Aug. 8, 2016, Copyright© 2016 American Chemical Society, https://pubs.asc.org/doi/abs/10.1021/acs.nanolett.6b01816, 30 pages.
Chawin Sitawarin, et al., "Inverse-designed photonics fibers and metasurfaces for nonlinear frequency conversion [Invited]," B82, vol. 6, No. 5, May 2018, Photonics Research, 2018, 8 pages.
Cheng Wang et al., "Ultrahigh-effciency second-harmonic generation in nanophotonic PPLN waveguides," arXiv:1810.09235 [physics.app-ph], Sep. 24, 2018, 5 pages.
MIT Technology Review, "The Danger of Green Laser Pointers," Jan. 16, 2019, downloaded from https://www.technologyreview.com/s/420214/the-danger-of-green-laser-pointers/, 3 pages.
Guan-Bo Lin et al., U.S. Appl. No. 16/121,002, filed Sep. 4, 2018, entitled "Light Frequency Upconversion of Laser Light, for Cleansing," 39 pages.
Khanikaev et al., "Photonic Topological Insulators," Nature Materials, Mar. 2013, vol. 12, pp. 233-239.
Kim et al., "Extremely Broadband Topological Surface States in a Phonic Topological Metamateial," Advanced Optical Materials, 2019, vol. 7, Issue 20, 8 pages.
Non Final Office Action for U.S. Appl. No. 16/121,002, dated Apr. 28, 2020, 22 pages.
Notice of Allowance for U.S. Appl. No. 16/121,002, dated Aug. 28, 2020, 16 pages.

* cited by examiner

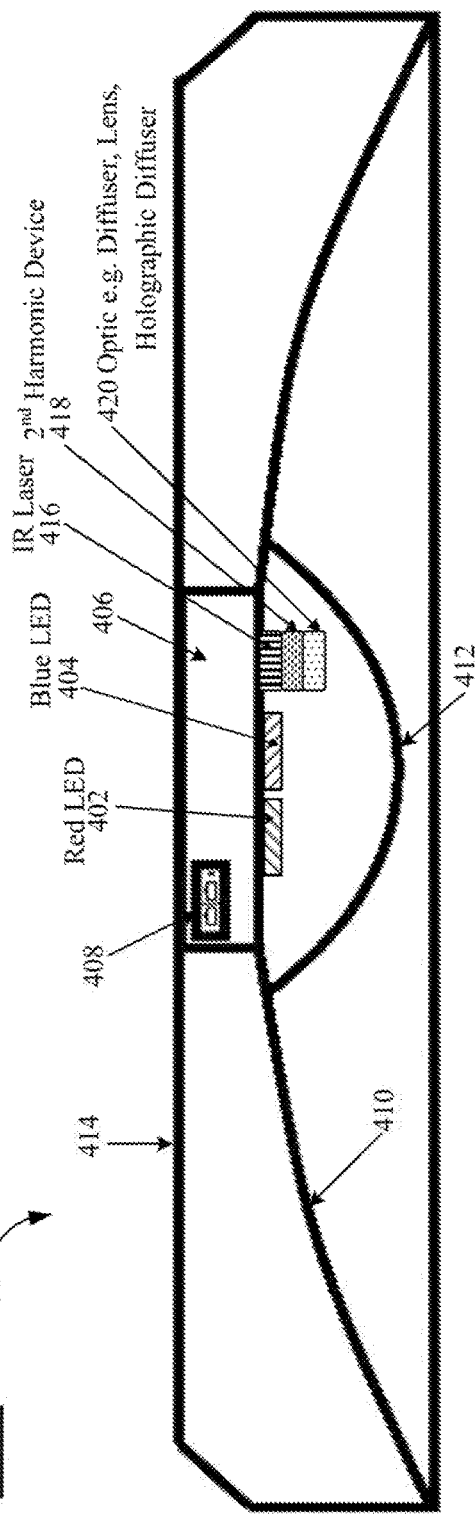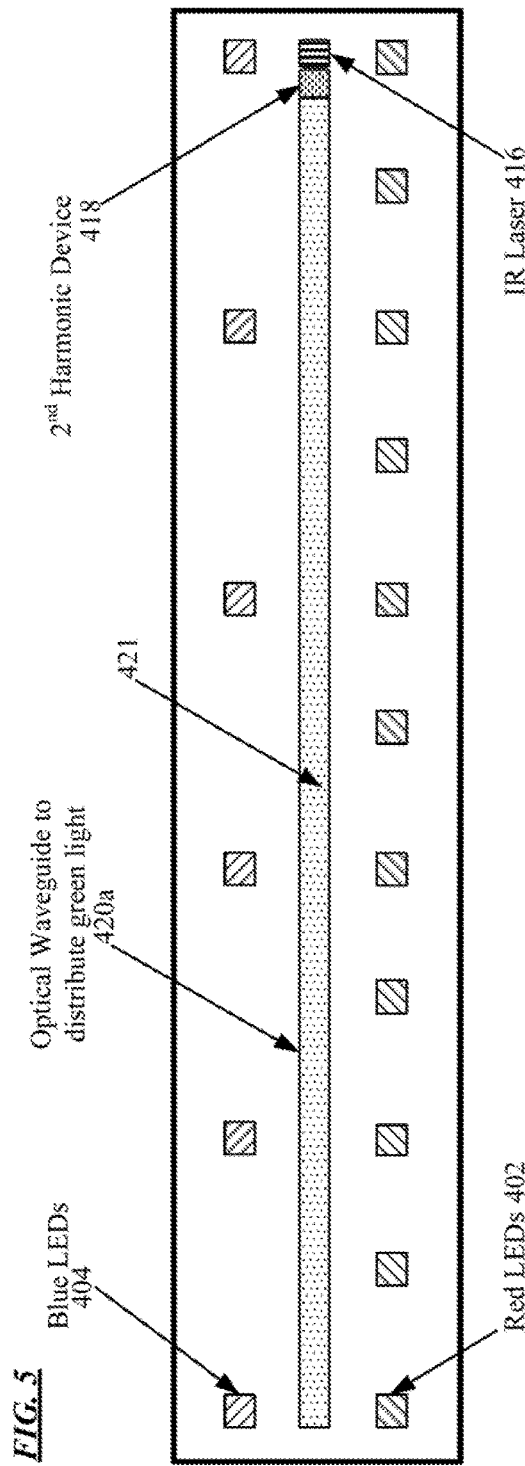
FIG. 4
FIG. 5

LIGHT FREQUENCY UP-CONVERSION OF LASER LIGHT, FOR PRODUCING GREEN OR YELLOW LIGHT

TECHNICAL FIELD

The present subject matter relates to general illumination techniques and equipment that utilize a frequency up-conversion of laser light, for example, to produce visible light in the green or yellow portion of the spectrum, e.g. for combining with light from one or more sources of light of other color characteristic(s) in the visible light spectrum.

BACKGROUND

In recent years, light fixtures and other types of luminaires have increasingly utilized solid state light sources to generate light for artificial illumination. The most common type of solid state light source for such applications is the light emitting diode (LED). Many luminaires produce white light for general illumination with relatively stable pre-defined color characteristics, e.g. having specified one or more of: correlated color temperature (CCT), color rendering index (CRI), color reference R9, or the like. For such applications, the most typical approach uses LED devices that have blue or near UV LEDs and incorporate phosphors or other luminescent materials that convert some of the short wavelength light from the LEDs to longer wavelengths to form a white light output exhibiting the specified color characteristic(s).

An alternate approach, which also may allow tuning of the color characteristic of the luminaire output, utilizes LEDs emitting light of two or more colors and an optical element to mix the outputs of the LEDs at least in the far field where the illumination light output is useful to occupants in an illuminated space. Light is additive. The combined light output from the luminaire includes the color component lights emitted from the various LEDS and exhibits an overall color characteristic determined by the relative contributions from the LEDs of the respective different colors. Red (R), Green (G) and Blue (B) light, for example, can be combined to form light that appears white to the eye of a human observer. If the RGB channels are independently controllable, the selection of the variable RGB intensities allows a controller or user to 'tune' the color characteristic of the light output of the luminaire over a wide region of the visible light color gamut. Other combinations of different color LEDs may be used for various applications, such as RGB plus white (W, where the white LEDs devices incorporate phosphors or the like), RGB plus amber (A), and other combinations of four or more different types/colors of LEDs.

Many of the luminaires that use combinations of different color LEDs include one or more green (G) and/or yellow (Y) LEDs. Currently available LEDs configured for emission in the green or yellow region of the visible spectrum, however, exhibit lower efficiencies than LEDs configured for red or blue emission; and this phenomenon is sometimes euphemistically referred to as the "green gap."

Infrared lasers have been used to produce green light, particularly for laser pointers or the like. The lumen output and efficiency of such devices, however, have been low. Dispersal of light from a laser beam over a wide angular area for general illumination may further reduce overall light output efficiency (e.g. output lumens per watt of electrical input power). As a result, such a technique has not been adopted as a solution to the "green gap" problem in solid state lighting for general illumination applications.

SUMMARY

The concepts disclosed herein alleviate the above noted problems with producing green or yellow light for general illumination, by utilizing a laser and a frequency up-converter.

A luminaire, for example, includes a first light source including one or more solid state emitters, configured to emit light of dominant wavelengths in two separate ranges of the visible spectrum. The luminaire also includes a second light source configured to emit green or yellow light in a third wavelength range between the two separate ranges of the visible spectrum. The second light source uses a solid state laser emitter configured to emit laser light having a dominant wavelength in the infrared range of the spectrum. The second light source also includes a light frequency up-converter, coupled to convert the laser light emitted by the solid state laser emitter to green or yellow light having a dominant wavelength in the third wavelength range. The luminaire also has an output configured to emit a combination of light in the wavelength ranges from the first light source and the light frequency up-converter of the second light source, for a general illumination application of the luminaire.

The emitters of the first light source may be of any appropriate type. Several examples utilize light emitting diodes. Other examples utilize one or more laser emitters.

Hence, another example luminaire has a first solid state laser emitter configured to emit first laser light having a dominant wavelength in a range of 380 nm to 495 nm and a second solid state laser emitter configured to emit second laser light having a dominant wavelength in a wavelength in a range of 600 nm to 750 nm. The luminaire also includes a third solid state laser emitter configured to emit laser light having a dominant wavelength in the infrared range of the spectrum above 750 nm. A light frequency up-converter converts the infrared laser light from the third solid state laser emitter to visible green or yellow light in a wavelength range of 495 nm to 600 nm. The luminaire also includes one or more optics coupled to receive light from the first and second solid state laser emitters and to receive light from the light frequency up-converter. The optic(s) is/are configured to provide an output of the luminaire combining light having the dominant wavelength in the range of 380 nm to 495 nm, light having the dominant wavelength in the range of 600 nm to 750 nm, and visible green or yellow light in the wavelength range of 495 nm to 600 nm. The optic(s) also is/are configured to provide an output of such combined light over an output distribution for a general illumination application.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations, by way of example only, not by way of limitations. In the figures, like reference numerals refer to the same or similar elements.

FIG. 4 is a cross-sectional view of an example of a luminaire with a laser and frequency up-converter (e.g. a second harmonic device) as a source of green or yellow light and LEDs as sources of red and blue light.

FIG. 5 is a plan view of the LEDs as well as the laser source, the second harmonic device and a waveguide as an example of a dispersal optic, as an example of an implementation of the sources of the luminaire of FIG. 4.

DETAILED DESCRIPTION

Figure 1:
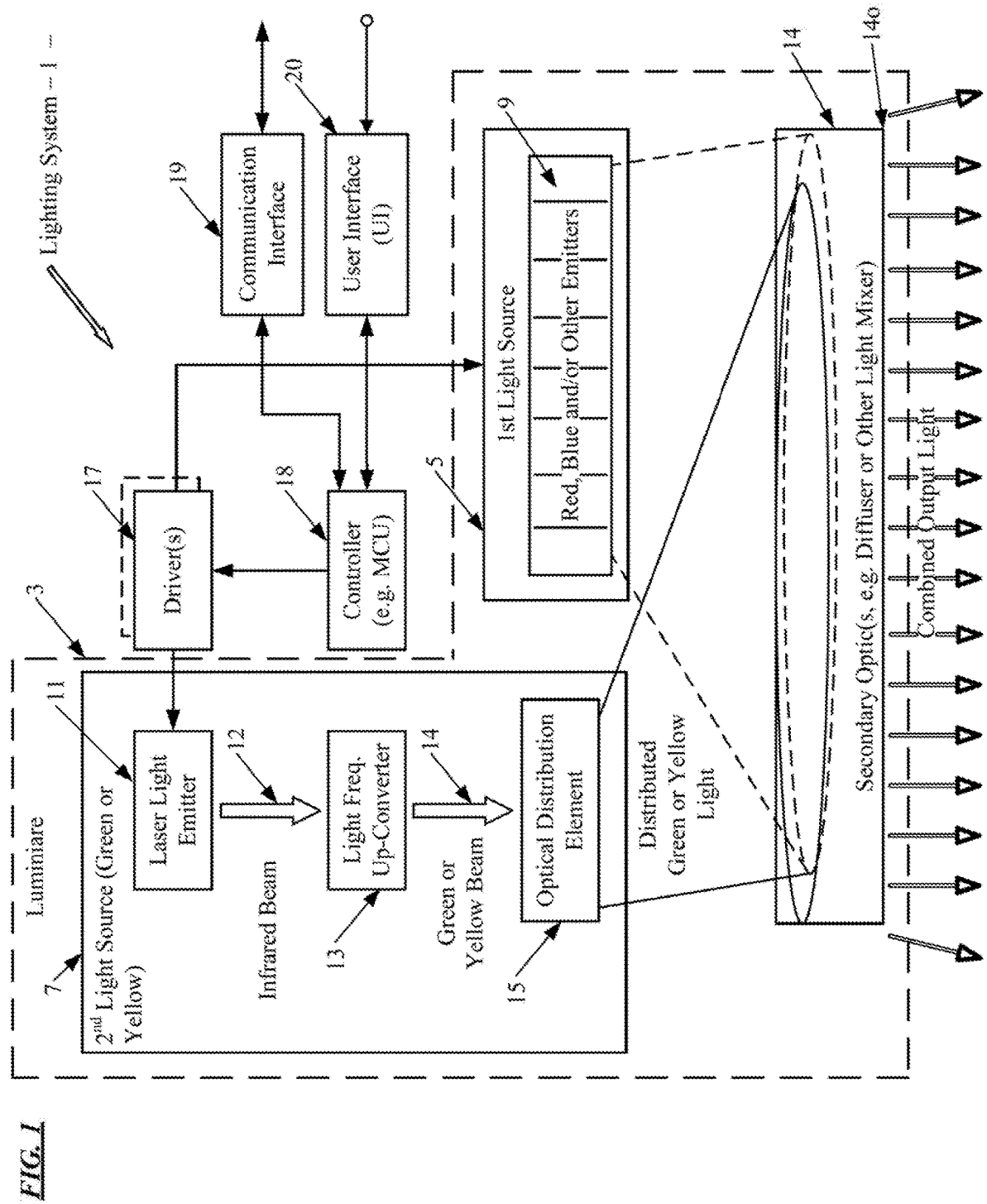
FIG. 1 is a high level functional block diagram example of a lighting system, which includes a luminaire having a laser and frequency up-converter as a source of green or yellow light and a source of other visible color(s) of light, together with circuit elements to operate the light sources of the luminaire and provide related control and/or communication functionalities.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Solid state lighting devices, particularly LEDs, are inefficient at generating yellow and green light. The examples described below and shown in the drawings address this "green gap" issue using infrared laser light and a light frequency up-converter to generate desired green or yellow light, for artificial lighting for general illumination purposes. A luminaire, for example, may include a source (e.g. emitters of at least two different types) configured to provide two other colors of light, such as red and blue light. Those colors of light, however, do not include a substantial amount of green or yellow light, e.g. not enough green or yellow light to satisfy color requirements of an intended artificial general illumination application of the luminaire. The luminaire includes a solid state device (e.g. a laser diode) to produce an infrared laser beam, which the light frequency up-converter converts into green or yellow light. The luminaire outputs a combination of the various colors of lights from the sources, for example red and blue with green or yellow to produce white light. If the different emitters are independently controllable, the luminaire may be adjusted or 'tuned' to output white light of different color characteristics and/or to output light of various colors over a wide region of the visible light color gamut.

The term "luminaire," as used herein, is intended to encompass essentially any type of device that processes energy to generate or supply artificial light, for example, for general illumination of a space intended for use such as occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as highlighting and object or feature on a surface, signage, illuminating at or around an entrance, or to indicate an exit. In most examples, the luminaire(s) illuminate an indoor or outdoor space or area of a premises to a level useful for a human in or passing through the space, e.g. lighting for a room or corridor in a building or of an outdoor space such as a street, sidewalk, parking lot or performance venue.

Terms such as "artificial lighting," as used herein, are intended to encompass essentially any type of lighting in which a device produces light by processing of electrical power to generate the light suitable for a general illumination application. An artificial lighting device, for example, may take the form of a lamp, light fixture, or other luminaire that incorporates a light source, where the light source by itself contains no intelligence or communication capability, such as a configuration of the source(s) together as a lamp (e.g. "regular light bulb") of any suitable type. The illumination light output of an artificial illumination type luminaire, for example, may have an intensity and/or other characteristic(s) that satisfy an industry acceptable performance standard for a general lighting application.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry light or signals.

Light output from the luminaire may carry information, such as a code (e.g. to identify the luminaire or its location) or downstream transmission of communication signaling and/or user data. The light based information transmission may involve modulation or otherwise adjusting parameters (e.g. intensity, color characteristic or distribution) of the illumination light output from the luminaire or any one or more of the color components combined in the output.

Figure 2:
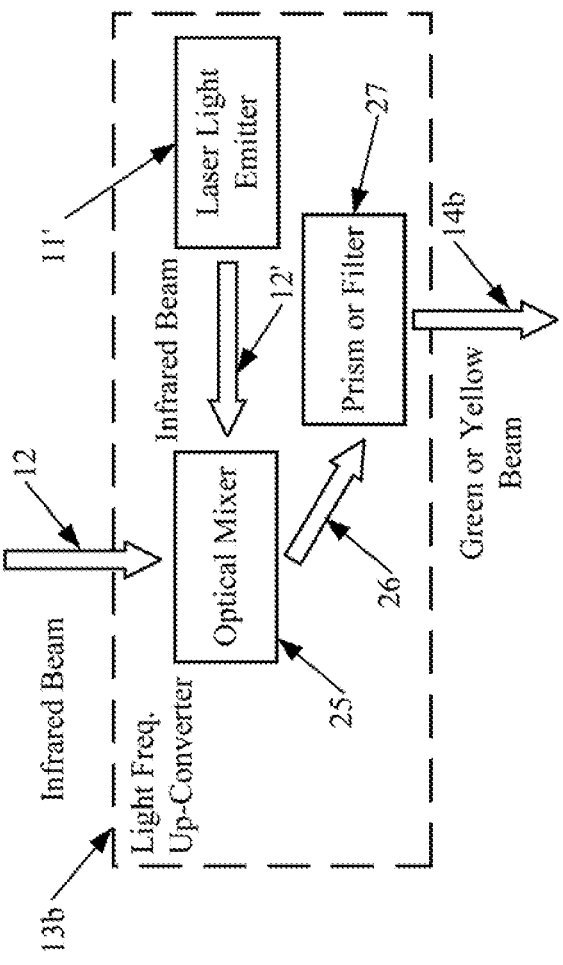
FIG. 2 is a high level example of a light frequency up-converter using a harmonic generator.
Figure 3:
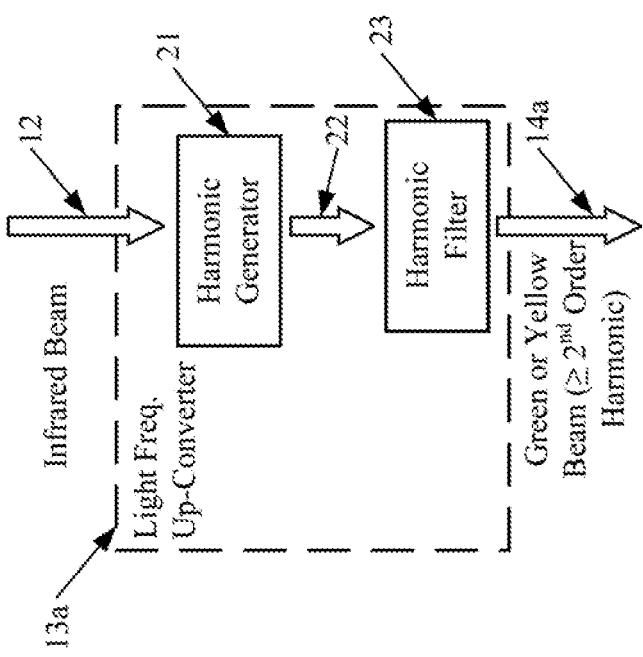
FIG. 3 is a high level example of a light frequency up-converter using an additional laser and an optical mixer.

Reference now is made in detail to the examples illustrated in the accompanying drawings and discussed below. Several of the drawings, e.g. FIGS. 1 to 3 and 6 to 8, use block arrows or dashed or dotted arrows to represent light beams. The direction of such arrows in the drawings, however, are for ease of illustration only. In actual implementations of lighting devices or luminaires, the beams may be aimed in a variety of different directions, to facilitate optical processing by the various components discussed herein and/or to direct the output light for general illumination in a manner suitable to a particular installation or artificial lighting application. Also, FIGS. 1 to 3 show light outputs from the example luminaires in a downward direction, for example, as if mounted to direct output light down from a ceiling, pedestal or lamp post through an illuminated volume toward a floor or a work surface positioned above the floor.

Figure 6:
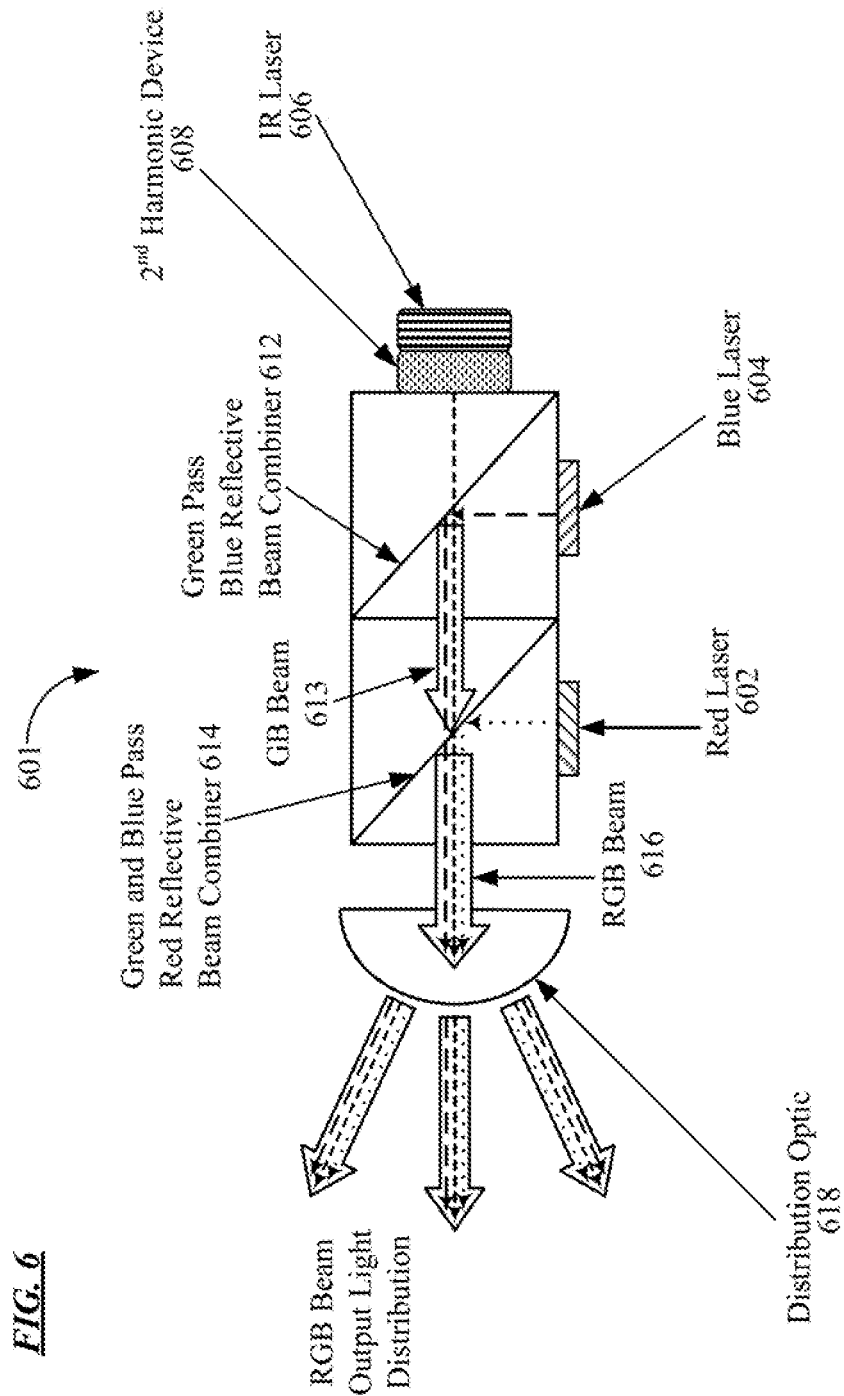
FIG. 6 is a side view of example elements of a luminaire, using a laser and second harmonic device to produce the green or yellow light and laser diodes to produce red and blue light.
Figure 7:
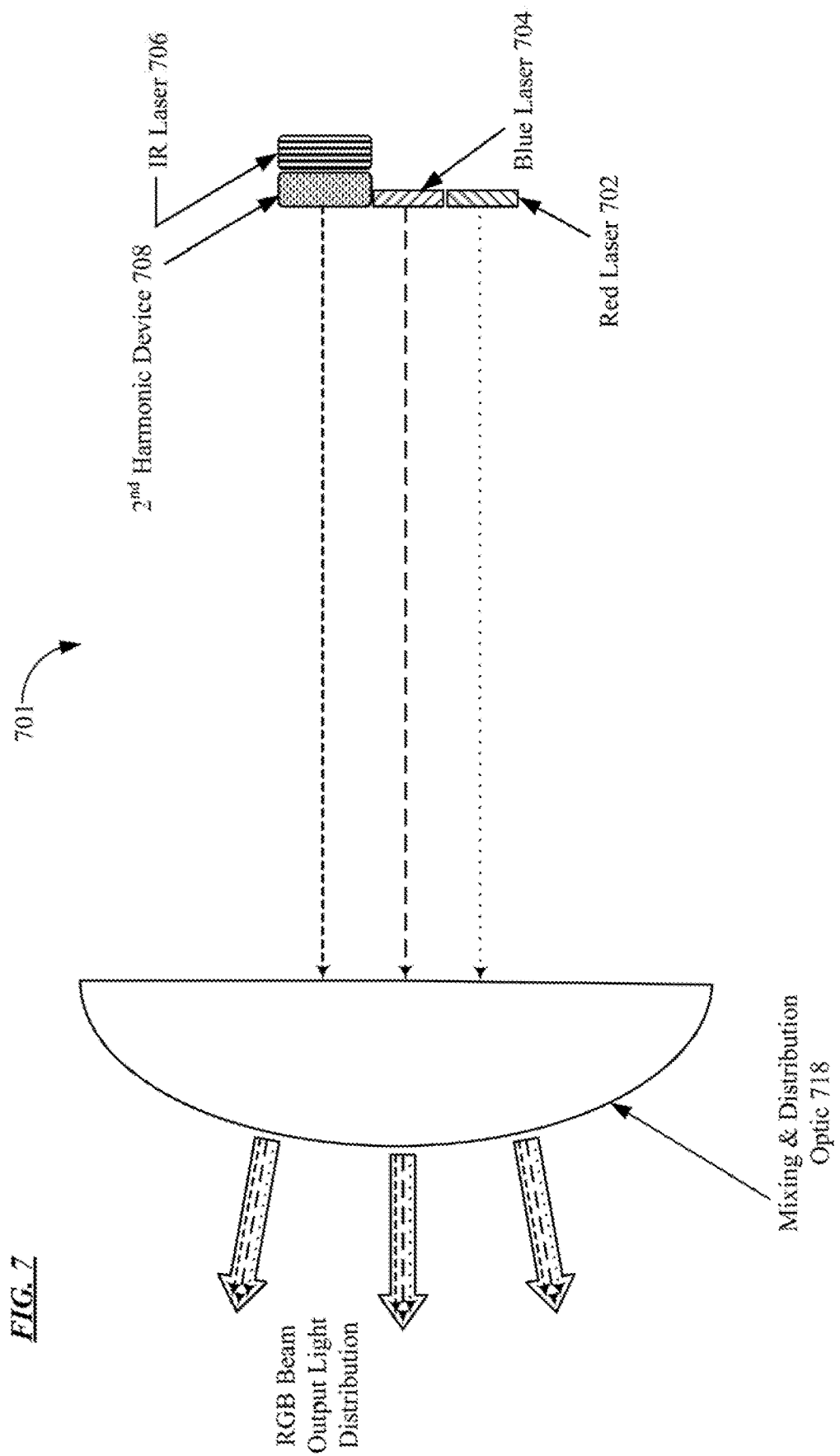
FIG. 7 is a side view of example elements of another luminaire, using a laser and second harmonic device to produce the green or yellow light and laser diodes to produce red and blue light.
Figure 8:
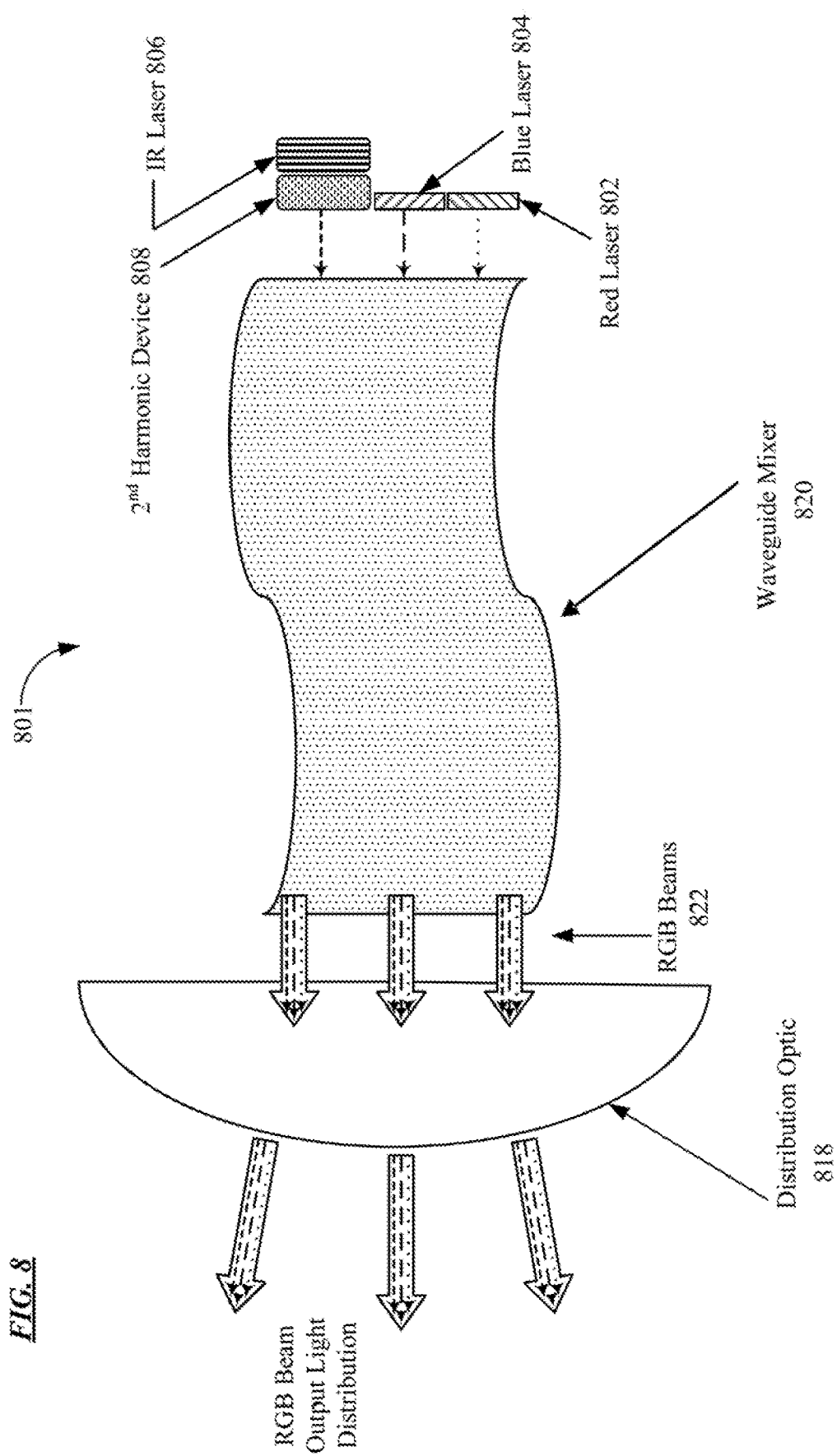
FIG. 8 depicts the elements of a luminaire similar to those of the luminaire of FIG. 7 but with an added optical waveguide for additional mixing of the light of different colors.

Later FIGS. 6 to 8 show light outputs from the example luminaires in generally horizontal direction. It should be apparent that a lighting device or luminaire may be positioned in a variety of other orientations suitable to a particular space or surface area and/or for desired artificial general illumination.

FIG. 1 is a high level functional block diagram illustration of a lighting device or system 1 that includes a luminaire 3 and several other components. The luminaire 3 includes a first light source 5 and a second light source 7.

The first light source 5 includes one or more solid state emitters 9, such as LEDs suitable for artificial general lighting applications, configured to emit light of dominant wavelengths in two separate ranges of the visible spectrum. Other types of solid state emitters may be used, and several later examples utilize laser diodes. Although the LEDs or the like may emit other visible light of wavelengths above or below the ranges typical of green and yellow light, the illustrated examples typically involve emission of light having a dominant wavelength in the visible red light range and light having a dominant wavelength in the visible blue light range. The second light source 7 is configured to emit green or yellow light having a dominant wavelength in a third wavelength range between the two separate ranges of the visible spectrum of the light emissions by the emitters of the first source, e.g. between the red and blue visible light ranges.

The visible portion of the electromagnetic spectrum runs from violet light at approximately 380 to red light at approximately 750 nm. Green light may have a wavelength range of approximately 495 nm to 570 nm; and yellow light may have a wavelength range of approximately 570 nm to 600 nm. Hence, in the example, the second source 7 is configured to emit green or yellow light in a wavelength range of approximately 495 nm to 600 nm. The emitter(s) 9 of the first light source 5 emit light in a wavelength range of approximately 380 nm to 495 nm that encompasses the blue range of the spectrum. The emitter(s) 9 of the first light source 5 also emit light in another wavelength range of approximately 600 nm to 750 nm, which includes the red range of the spectrum.

The second light source 7 uses a solid state laser emitter 11 configured to emit laser light having a dominant wavelength in the infrared range of the spectrum. The infrared portion of the electromagnetic spectrum runs from approximately 750 nm (just above the longest wavelength of the visible red portion of the spectrum) up to approximately 1 mm. The second light source also includes a light frequency up-converter 13, coupled to convert the laser light in the infrared range emitted by the solid state laser emitter 11 to green or yellow light having a dominant wavelength in the third wavelength range from approximately 495 nm to 600 nm.

Green or yellow light may be created using up-conversion to a second, third fourth or higher order harmonic frequency and thus having a corresponding division of wavelength by two, three, four or higher. Each such higher order approach would use a corresponding longer wavelength infrared laser light emitter to produce a particular visible light wavelength in the green or yellow range. For example, a second order harmonic device converts laser light in a range of 1000 nm to 1,200 nm to light in the 500 nm to 600 nm range for green or yellow light. As a more specific example to produce 500 nm green light, a laser diode or the like is selected that produces a laser beam having a spectral power distribution around a dominant wavelength of 1,000 nm, and a second harmonic device converts that 1,000 nm light to green light having a spectral power distribution around a dominant wavelength of 500 nm. As another example, if using a laser emitter having a dominant wavelength output at 1,500 nm, a third order harmonic device converts the 1,500 nm light to green light having a spectral power distribution around a dominant wavelength of 500 nm. If using a 2,000 nm laser emitter, a fourth order harmonic device (or two second order harmonic devices used in sequence) converts the 2,000 nm light to light having a spectral power distribution around a dominant wavelength of green light at 500 nm. An alternate approach discussed in more detail with respect to FIG. 3 utilizes an additional laser emitter and a mixer for the up-converter to convert infrared light to green or yellow light.

The luminaire 3 also has an output 14o, for example, via a secondary optic 14. From output 14o, the luminaire 3 emits a combination of light in the wavelength ranges from the first light source 5 (e.g. red and blue) and the light from the frequency up-converter 14 (e.g. green or yellow), for a general illumination application of the luminaire 3. For example, to create white light, a luminaire might can combine selected intensities of blue and red light with a selected intensity of the green light produced via the laser emitter and the up-converter. To improve CRI, a luminaire might can combine blue and red light with green light produced via the laser and the up-converter as well as yellow light produced by an appropriate laser emitter and up-converter. Other conventional emitters of other color(s) also may be added, such as an amber LED, to further improve CRI or other color characteristic such as R9.

As outlined above, the source 7 in the luminaire 3 includes a laser light source 11, which emits a beam of light 12 in the infrared range. Although other laser emitters may be used, the example laser emitter 11 includes one or more laser diode devices. Examples of suitable laser diodes for implementing the laser light emitter 11 include edge emitting laser (EEL) diodes of suitable wavelengths and vertical cavity surface emitting laser (VCSEL) diodes of suitable wavelengths. For luminaires, particularly those using LEDs for the emitter 9 of the other light source 5, it may be more convenient to integrate lasers into the luminaires by using one or more VCSEL type laser diodes because that type of laser diode uses a packaging arrangement that is similar to the packages of LEDs used today in luminaires. It should be understood, however, that these examples are non-limiting and that other types of laser diodes or other laser emitter devices may be used to implement the emitter(s) 11.

The light source 7 also includes the light frequency up-converter 13 coupled to receive the beam 12 from the laser light emitter 11. The light frequency up-converter 13 is configured to convert the laser light 12 of the infrared wavelength(s) emitted by the laser light emitter 11 to yellow or green light having a dominant wavelength in the range from approximately 495 nm to 600 nm. The green or yellow beam output by the light frequency up-converter 13 is shown diagrammatically by the arrow 14. The dominant wavelength in the green or yellow and possibly the spectral power distribution of the beam 14 around that wavelength are chosen by optimizing the design of the light frequency up-converter 13 for a particular general illumination application. Examples of suitable light frequency up-converters are described in more detail later.

The green or yellow light source 7 in the example also includes an optical distribution element or first optic 15. The optical element 15 is coupled to the light frequency up-converter 13 to receive the light beam 14 having the wavelength(s) intended to provide light in the green or yellow range for combination with the light (e.g. red and blue) from the light source 5, for example to fill the 'green gap' between the spectral power distributions of light outputs from the emitter(s) 9 of the light source 5. The optical distribution element 15 distributes the green or yellow light in a manner to facilitate additive combination thereof with the light output from the emitter(s) 9 of the light source 5. In an example using LEDs for the emitters 9 of the source 5, the LEDs provide a substantially uniform intensity over wide angular distribution approaching a Lambertian distribution, although the angular range may be limited by one or more collimating optics (not shown). The optical distribution element 15 may distribute light from the beam 14 over a similar angular region, although perhaps with a distribution that is not as uniform in intensity. For example, the one beam 14 may be split into a large number of lower intensity beams within an intended angular range, e.g. by a holographic beam splitter implementation of the element 15.

In addition to the elements of the luminaire 3, the drawing shows examples of several other elements that may be used in the light system 1 with the luminaire 3 using the laser emitter 11 and light frequency up-converter 13 for the source 7 of green or yellow light. For example, the system 1 of FIG. 1 includes one or more drivers 17 and a controller 18. The luminaire 3 may incorporate one or both of the driver 17 and the controller 18, or the driver 17 and/or the controller 18 may be separately located and coupled to the components of the device 11 by appropriate power and/or control links.

The example luminaire 3 utilizes solid state light emitters in both light sources 5, 7. In many implementations, such solid state emitters emit light in response to direct current (DC) of an appropriate magnitude. The driver or drivers 17 provide channels of DC current for operating each different type of emitters in the light sources 5 and 7. For example, if the light source 11 includes separately controllable red emitters and blue emitters, the driver 17 would provide two independently controllable channels of drive current to the two different types of emitters (among emitters 9) in that light source 5. The driver 17 would provide another independently controllable channel of driver current to the laser light emitter(s) 11 of the green or yellow light source 7. In such a three channel example, one driver may provide three drive current outputs. Alternatively, one driver circuit may provide two channels for the red and blue emitters and another driver circuit may provide the third channel for the laser diode(s) of the laser light emitter 11; or the driver 7 may include three separate driver circuits, one for each controllable output channel. The three output channels may be preset to provide predefined regulated current magnitudes that remain relative constant. Many examples of the system 1 are intended to provide adjustable overall output intensity and/or 'tunable' color characteristic(s) in the combined light from the output 14o of the luminaire 3. For such adjustable/tunable applications, the system 1 provides independently controllable output channels from the driver(s) 17 to the different types of emitters 9, 11 of the sources 5, 71, to allow selection of the amounts of the different colors of light in the combined output of the luminaire 3.

Although not shown, the driver or drivers 17 may receive power from AC mains, in an approximate range of 7100V AC to 488V AC, e.g. 120V AC or 220V AC. A suitable driver, for example, may be a multi-volt input device capable of driving the LEDs serving as emitters 9 and/or one or more laser diodes of emitter 11 using power obtained from any AC source in a range of 120V AC to 227V. It is also possible to implement the system 1 with low voltage DC power supply as driver 17, such as a 24V supply. As another alternative, the system 1 may use a battery power source, as an alternative or a backup to AC mains power.

The controller 18 may be a simple device such as an ON/Off switch, which also serves as a user interface. Although not shown for convenience, the controller may be (or be responsive to) a sensor, e.g. an occupancy sensor or an ambient light level or a color characteristic sensor. A purpose-built logic and circuitry arrangement may be used, for somewhat more sophisticated control functions. Another alternative is to implement the control functions using a programmable control system, for example, using a microcontrol unit (MCU) or a microprocessor (μP) as the main logic or intelligence of the controller 18. For purposes of discussion of a specific example, it is assumed that the controller uses an MCU.

An MCU typically is a microchip device that incorporates the actual processor circuitry in the form of a central processing unit (CPU) along with various memories for storing instructions for execution by the CPU as well as data having been processed by or to be processed by the CPU, and input/output ports (I/O) for suitable connection/communication of the MCU with other system elements. The memory, for example, may include volatile and non-volatile storage; and program instructions stored in the memory may include a lighting application (which can be firmware), in this example, for implementing the processor functions of the controller 18 relating to controlling the light outputs from the sources 5 and 7 and thus characteristics of the combined light output from the luminaire 3. The circuitry forming the various elements of the MCU typically are all included on a single chip and sometimes referred to as a "system on a chip" or SoC. Although shown separately, the MCU serving as the controller 18 may be incorporated on a chip with a multi-channel driver acting as the circuitry of driver(s) 17 and/or with circuitry of a network communication interface 19.

The example represents an arrangement in which one controller 18 controls the emitters of light sources 5, 7 of a single luminaire 3, to provide adjustable general illumination light in a room or other space. In the illustrated example, the driver(s) 17 and the associated controller 18 may be elements of a control module or the like that is somewhat separate from the luminaire 3, even if the module only controls and drives the light emitters of one luminaire 3. The driver 17, the controller 18 and/or the communication interface 19, however, may be incorporated in the luminaire 3. The lighting system 1, however, may be easily modified to include and control a larger number of such luminaires 3. For example, the driver(s) 17 may be expanded to provide controlled drive channel outputs to the LEDs and laser diodes of the sources 5, 7 in each of one or more additional luminaires 3. In an alternate approach for unified processor control of a larger number of luminaires 3, each luminaire may include the appropriate one or more drivers 17; and one MCU or the like may control two or more such driver-integrated luminaires.

The communication interface 19 may be any communication device suitable for lighting related local communications between the system 1 and other similar systems, with common control equipment such as wall controllers or on-premises servers or gateway, or even with an external wide area network (WAN). The communication interface 19, for example, may be a network access card supporting wired connectivity over a data network, such as wired or optical fiber Ethernet, or may be a wireless transceiver compatible with a standardized wireless communication protocol, such as WiFi, Zigbee, personal area network (PAN) e.g. in the 900

MHz band, Bluetooth or Bluetooth Low Energy (BLE), LiFi, etc. Network communications, for example, may allow operation of a group of neighboring luminaires 3, for each of some number of zones in a large space, in a coordinated way to implement coordinated and/or monitored general illumination throughout a large premises.

The system 1 also includes a user interface device 20. Although some drivers may be configured to receive input from the user interface directly, the example arrangement involves input from the user interface device 20 to the controller 18 and possibly output from the controller 18 to the user interface device 20. The user interface device 20 may be a simple switch, a dimmer, a keypad, touchpanel etc. In the example implementation, the controller receives input from the user interface device 20 and controls the driver(s) 17 based on the received inputs. Depending on the implementation of the user interface 20, the controller 18 may be configured to respond to an input received via the user interface 20, for example, to adjust one or more of: ON/OFF state of emitter(s) either one or both of the light sources 5 and 7; or the relative intensities of output from the light produced by the source 7 and the light produced by the independently controllable emitters 9 (e.g. the red and blue LEDs) of the light source 5.

The light frequency up-converter 13 may be implemented by a variety of different technologies. Although other types of up-converters may be used or developed in future, two general types of up-converters will be discussed by way of non-limiting examples. One general category of suitable light frequency up-converters generates light of a frequency harmonic (frequency is an integer multiple of the laser frequency) and thus having a corresponding shorter wavelength (wavelength divided by the integer). The second general category of suitable light frequency up-converters discussed herein uses an additional laser and an optical mixer to generate a higher frequency (shorter wavelength) for the green or yellow light.

FIG. 2 is an example of a light frequency up-converter 13a using a harmonic generator 21. The higher frequency harmonic output beam 22 exhibits an inversely smaller wavelength. For example, generation of a second order harmonic (frequency doubling) results in harmonic light having a dominant wavelength that is half the dominant wavelength of the original laser light; generation of a third order harmonic (frequency tripling) results in harmonic light having a dominant wavelength that is one-third the dominant wavelength of the original laser light; and so on for higher order harmonics.

Generation of a second order harmonic of a laser beam involves two photons of the same frequency interacting via a nonlinear optical material. The nonlinear processing via the material optically combines energy from the two photons of the same frequency so as to create one new output photon. The output photon has approximately twice the energy of one original photon (combines energy from the two received/original photons). The resulting higher energy photon has a frequency approximately twice that of one original photon and thus approximately half of the light wavelength of the original photons. Similarly, generation of a third order harmonic of a laser beam involves three photons of the same frequency interacting via a nonlinear optical material. The nonlinear processing via the material optically combines the three photons so as to create one new output photon. The output photon has approximately three-times the energy of one original photon (combines energy from the three received/original photons). The resulting higher energy photon has a frequency approximately three-times that of the original photons and thus approximately one third of the light wavelength of the original photons.

Similar techniques may generate fourth and still higher order harmonics. Alternatively, higher frequency/shorter wavelength harmonics may be generated by stacking nonlinear materials forming a multiple-harmonic generator, e.g. two successive second order harmonic generators to produce output light approximately one fourth the wavelength and approximately four times the frequency of the original laser photons.

For example, for a general illumination application utilizing green light of 500 nm and a laser emitter 11 that provides ~1000 nm light, a second order harmonic implementation of the converter 21 produces ~500 nm light (500 nm dominant wavelength) in the green range. Similarly, if the laser emitter 11 provides ~1500 nm light, then a third order harmonic implementation of the converter 21 produces ~500 nm light; and if the laser emitter 11 provides ~2000 nm light, then a fourth order harmonic implementation of the converter 21 produces ~500 nm light; and so on. By way of other examples, if the laser emitter 11 provides ~1150 nm light, then a second order harmonic implementation of the converter 21 produces ~575 nm light (575 dominant wavelength) in the yellow range; and if the laser emitter 11 provides ~2300 nm light, then a converter implementation that provides a second order harmonic and then provides a further similar second order harmonic conversion again can provide ~575 nm light.

There are a number of types of available nonlinear materials that may be tailored to convert available infrared laser light to harmonics suitable to generation of green or yellow light for general illumination applications. Two general categories of suitable materials are nonlinear crystals and nonlinear metamaterials, although other types of non-linear materials may be suitable. Alternative approaches for second harmonic generation utilize suitable optical waveguides or resonators, which may be in micro/nanoscale depending on fundamental frequency and converted frequency. The non-limiting categories of upconverter materials/devices are discussed in somewhat more detailed below.

In one example category of nonlinear materials, the harmonic generator is a nonlinear crystal material. The chemical and crystalline properties of the material can be chosen/controlled during manufacture to obtain the desired harmonic generation between a particular input infrared beam (e.g. of a particular dominant frequency and/or wavelength) and a harmonic having a dominant wavelength in a desired green or yellow range suitable for combination in a general light type luminaire.

Example nonlinear crystals are birefringence crystals. Such a crystal has two different refractive indexes along two axes of the crystal. The fundamental laser beam 12 is focused and put through along a first optical axis of the nonlinear crystal. The incident laser beam 12 is separated into two different paths, one path having the fundamental wavelength of the input beam 12 while the other path performs n-order harmonic generation which meets a particular phase match condition.

Nonlinear crystal material, for example, may be manufactured from: ammonium dihydrogen phosphate (ADP), lithium triborate (LBO), lithium tantalate (LT), lithium niobate (LN), potassium dihydrogen phosphate (KDP), deuterated KDP (DKDP), potassium titanyl phosphate (KTP), beta barium borate (BBO), Lithium Iodate (LiIO3), AgGaS2, AgGaSe2, KNbO3 or the like. Traditional methods to manufacture a nonlinear crystal of properties for generating the n-order harmonic tailored to a particular wavelength range for the laser beam 12 from a particular infrared laser light source 11 involve material selection and appropriate control of pressure, temperature, etc. during the crystal growth process. The manufacturing technique, however, may create uncertainty as to conformance of resulting crystals to design parameters, the manufacturing process is time-consuming, and such crystals have limited nonlinear efficiency based on the nature of the materials used to form the crystals. Nonlinear crystals, the applicable materials and the procedures for crystal growth are fairly mature technologies utilized for other types of light processing applications. Once a recipe is found for crystal formation suitable for a particular conversion desired for an artificial lighting application, those nonlinear crystals could be fairly inexpensive solutions.

Green laser pointers have been developed that utilize a 1064 nm infrared laser and a KDP ($KH_2PO_4$) type non-linear crystal. This approach, however, has not been adopted for general lighting equipment. The lumen output and efficiency requirements of a laser pointer are much lower than for general illumination equipment. The laser diode for such a pointer device has relatively low power in comparison to emitters typically required for general illumination type applications, such as down-lighting, task lighting, wall grazing or washing, street lighting signage or the like. Also, conversion efficiency offered by the non-linear crystal tends to be rather low, which would reduce the overall efficiency of any luminaire for general lighting that utilized such a crystal material as part of the laser based green or yellow light source. In the examples of FIGS. 1 to 3, the laser diodes of the various emitters 11, 11' have a higher power suitable for general illumination. Although it may be possible to improve the conversion efficiency of non-linear crystals, another approach is to use a more efficient material in the up-converter.

Hence, in another example category of nonlinear materials, the harmonic generator 21 is formed of a nonlinear metamaterial. The nonlinear metamaterial may be a photonic crystal or other type of metamaterial; and the nonlinear metamaterial is of type/structure configured to exhibit: (a) resonance for frequency of infrared light from the laser light source and resonance for the light of the second or higher order harmonic; (b) substantial mode overlap between the frequency of light from the infrared laser light source and harmonic frequency of the light of the second or higher order harmonic; and (c) intrinsic nonlinear material or phase matching. Examples of suitable photonic crystal metamaterials include nonlinear metamaterials having an all dielectric cylinder structure and topological metamaterials. Other examples of suitable nonlinear materials include metamaterials having a gold split resonator structure or a gold cross bar structure.

The nonlinear metamaterials, for example, can be made by nanoscale three-dimensional (3D) printing, nanoimprinting, or photolithography. Such manufacturing techniques are less time consuming than crystal growth. The techniques for making nonlinear metamaterials also provide better control of the structure during manufacturing, which thereby enables efficient tailoring of the material structure to a particular application, in this case, conversion from a particular beam frequency/wavelength in the infrared range to the harmonic frequency/wavelength selected for the green or yellow light. The nonlinear metamaterial approach also has other advantages over the nonlinear crystals in that the manufacturing techniques allow for design of material permeability, permittivity, and/or susceptibility of the harmonic generator 21, according to size, material, and geometry of the nonlinear metamaterial. Use of the nonlinear metamaterial also enables tighter field confinement and higher field enhancement due to resonance, which provides more efficient frequency mixing. As a result, green or yellow light sources 7 utilizing nonlinear metamaterials in the implementation of the light frequency up-converter may offer a higher light conversion efficiency, which would improve the overall efficiency of the source 7 and thus the luminaire 3 for general lighting applications.

Alternative approaches for harmonic generation utilize suitable optical waveguides or resonators, which may be in micro/nanoscale depending on the fundamental frequency of the applied light and the converted frequency of the output light. The cost and conversion efficiency of waveguides and/or resonators are between those of the nonlinear crystal and nonlinear metamaterial discussed above. The waveguide or resonator tolerates at least the fundamental input frequency of applied laser light and the converted frequency (e.g. harmonic at two times the fundamental frequency for second harmonic generation). Both frequencies are presented, and even enhanced, in the waveguide or resonator. Both frequencies are coupled/overlapped well inside the waveguide or resonator. In a waveguide or resonator for second harmonic generation, for example, the material for implementing the optical waveguide or resonator is chosen so that second-order nonlinear susceptibility ($\chi 2$) is significant while attenuation and/or absorption for both frequencies are small or negligible. A suitable waveguide or resonator material does not need to be metamaterial, e.g. GaAs (gallium arsenide) is a known natural material and commonly-used as an optical waveguide or resonator material for second harmonic generation in response to infrared to produce green light.

A technique to increase conversion efficiency of second harmonic generation (SHG) involves increasing the interaction path length between fundamental frequency and converted frequency. In a waveguide structure, for example, the structure that utilizes a difference in refractive index to confine passage of certain wave frequencies may form a useful waveguide to increase SHG efficiency. For example, an optical fiber (high index core and low index cladding) is a circular waveguide structure. Germanium (Ge) and phosphor (P)-doped glass (silica) fiber designed as a waveguide for 1.06 μm infrared laser input light may be used to for SHG type up-conversion to produce 530 nm green light since such a fiber waveguide provides high second-order susceptibility along the optical fiber. Low loss and low attenuation are significant signatures for such a waveguide. There are other waveguide types, like planar waveguides, that may be useful for SHG. A waveguide that is several hundreds-of-microns-long or longer provides significant interaction length for 1 μm infrared input wave type light. Instead of interaction with one long waveguide, numerous planar waveguides could be another strategy to possess multiples of unit interaction length and thus high conversion efficiency is obtained.

On the other hand, a resonator utilizes a feedback loop to further shrink the dimension of the SHG device yet maintain the similar long, effective interaction path. Common resonators used for SHG include, for example, a whisper-gallery-mode resonator (WGMR) and a laser cavity. Consider a laser cavity as an example. In a cavity resonator, waves get into an enhanced loop if the cavity length equals integral times the half wavelengths. Again, low loss and high gain for SHG help to increase the field strength of fundamental frequency so that strong interaction/overlap/coupling between fundamental frequency and SHG frequency happens.

There also is a possibility that a hybrid SHG waveguide and resonator could be utilized. For example, a ridge waveguide resonator utilizes the index difference between air (low index) and GaP (high index) to form a waveguide; and at the same time, the high reflectivity at the ends of the cavity due to cleaved crystal surface configure the waveguide as a resonator as well.

Returning to the discussion of the example of FIG. 2, the beam 22 from the harmonic generator 21 will include the intended green or yellow harmonic and may include some other light components, such as a remnant of light of the original infrared dominant wavelength and frequency and/or other harmonics of the source beam 12. If desirable for a particular luminaire or particular lighting application, some or all of those other light components may be reduced or removed. For that operational purpose, the example light frequency up-converter 13a may also include a filter 23 to pass the desired harmonic and block other light outside a defined bandpass region around the intended dominant harmonic wavelength. As a result of the filtering, the light output beam 14a will predominantly include green or yellow light of a spectral power distribution around the dominant wavelength of the particular harmonic intended for combination with light from the other source 5 for the particular general lighting application. Alternatively, a prism may be used to separate the energy in the beam 22 and to direct only the appropriate n-order harmonic out as green or yellow beam 14, 14a to the distribution element 15. In the harmonic type conversion example, the harmonic generator 21 produces a selected second or higher order ($\geq 2^{nd}$ order) harmonic. The particular harmonic is selected by selection of the material and/or structure of the harmonic generator 21. The green or yellow light output from the up-converter 13a as beam 14a after filtering (if provided) is green or yellow light having wavelengths in the bandpass region around the particular dominant wavelength of the second or higher order ($\geq 2^{nd}$ order) harmonic.

FIG. 3 is an example of a light frequency up-converter 13b that utilizes an optical mixer 25 to produce the green or yellow beam 14b having the dominant wavelength in the intended green or yellow visible light range for general illumination.

In general, a mixer is a device that receives two input signals and outputs a mixed signal. The mixed output signal may have a frequency that is the sum of the frequencies of the input signals, or the mixed signal output signal may have a frequency that is the difference of the frequencies of the input signals. An up-converter utilizes a mixer configured to output a signal having a frequency that is the sum of the frequencies of the input signals. For applications in radio-frequencies and microwave frequencies, for example, mixers are implemented in the form of appropriate electronic circuitry. For light, a mixer for up-conversion may be implemented utilizing a material configured to have appropriate optical properties in the relevant light spectrum bands of the expected inputs and the desired output.

The optical mixer 25 in light frequency up-converter 13b is a material configured to perform a sum-frequency change function, for example, a form of optical frequency mixer configured to receive and mix photons of light of two different frequencies from two different sources. The material effectively combines two photons of different frequencies into one photon of higher energy and thus higher frequency and shorter wavelength. Rather than a doubling of frequency as in the second order harmonic generator 21, the optical mixer 25 produces a higher energy photon having a frequency corresponding approximately to a sum of the frequencies of the two original input photons. The example assumes a sum-frequency conversion for light of two beams of different frequencies. It should be understood, however, that similar techniques may be used that combine light of three or more beams of different frequencies to effectively sum the frequencies and produce corresponding shorter wavelength light.

The optical mixer 25 in the example therefore receives two input signals in the form of infrared light beams 12, 12' from the laser emitters 11, 11', and the optical mixer 25 outputs the result of the mixing of the two input light signals 12, 12' as a higher frequency light beam 26. The light beam 26 has a shorter wavelength inversely proportional to the sum of the higher frequencies of input light beams 12, 12'. The laser diode(s) serving as the laser emitter 11 supply the infrared light beam 12 to one input of the optical mixer 25. The light frequency up-converter 13b uses a second laser emitter 11' to supply the infrared light beam 12' to another input of the optical mixer 25. Although other types of laser devices may be used as emitter 11', in most examples, the second laser light emitter 11' is formed by one or more laser diodes structurally similar to the diode(s) forming examples of laser light emitter 11. In the mixer example, the laser diode(s) of the second laser light emitter 11' produce infrared light 12' of frequency and dominant wavelength different from the frequency and dominant wavelength of infrared laser light 12 output by the laser diode(s) of the first laser light emitter 11. The optical mixer 25 produces higher energy photons in beam 26 of higher frequency and thus shorter wavelength(s).

The visible green or yellow light beam 26 from the optical mixer 25 will include frequency components formed by the mixing function of the optical mixer 25 and may include some remnant(s) of either one or both of the light beams 12, 12' from the laser light sources 11, 11'. If desirable for a particular luminaire or particular lighting application, some or all of those other light components may be reduced or removed. For that operational purpose, the example light frequency up-converter 13b may also include a prism or filter 27 to output light at 14b that is in a range around a frequency/wavelength in the green or yellow range that is suitable for combination with other light from the source 5 for a particular general illumination application. The prism or filter 27 in the example of FIG. 3 may be similar to the filter 23 and/or the alternative prism discussed earlier relative to FIG. 2. As a result of the band selection by the prism or filter 27, the light output beam 14b will predominantly include green or yellow light of a spectral power distribution around the dominant wavelength intended for combination with light from the other source 5 for the particular general lighting application. The frequency of the green or yellow light output in the beam 14b in this example is essentially a sum of the frequencies of the infrared laser light of beams 12, 12'; and the dominant wavelength of the green or yellow light 14b is approximately the inverse of the sum of the frequencies of the laser infrared light of beams 12, 12'.

There are a number of available materials/structures that may tailored to mix infrared laser light to generate frequency-sum beam 26 in the optical mixer 25 of the light frequency up-converter 13b. Second harmonic generation, as in one of the harmonic examples discussed above relative to FIG. 2, is a special case of frequency-sum-generation by an optical mixer. In a device for second harmonic generation, both photons that are combined to form the new higher frequency (shorter wavelength harmonic) have the same frequency. As a result, the output photon has double the input frequency and half the wavelength. The optical mixer 25 may be formed of nonlinear crystal material or nonlinear metamaterial similar to such materials above described for a second harmonic generation version of generator 21. Alternatively, the optical mixer 25 may be formed of a suitable waveguide and/or resonator of any of the types described earlier. Although a nonlinear metamaterial, waveguide or resonator may be used to implement the optical mixer 25, in an example, the optical mixer 25 is a nonlinear crystal. The type of nonlinear crystal may be based on one of the earlier discussed crystal materials, such as LBO. Another example of a nonlinear crystal for use as the optical mixer 25 is crystalline bismuth triborate (BIBO).

The lasers and nonlinear crystal or metamaterials forming the optical mixer may be configured to provide phase matching between the input laser beams 12, 12' as well as with the resulting output beam 26. For a nonlinear metamaterial implementation, the inputs on the nonlinear metamaterial that received infrared beams 12, 12' from the laser light emitters 11, 11' may be configured to provide resonance at the respective frequencies of the infrared laser beams 12, 12'. The output surface on the nonlinear metamaterial forming the optical mixer 25 may be configured to provide resonance at the intended green or yellow frequency of the output beam 14b. The metamaterial may also provide a substantial mode overlap between the frequency of light of the output beam 14b and each of the frequencies of the beams 12, 12' from the laser light sources 11, 11'.

FIG. 4 is a cross-sectional view of an example 401 of a luminaire that incorporates laser and frequency up-conversion elements for green light generation and LEDs as emitters for other colors of light to be included in the output of the luminaire 401. In this non-limiting example, the first light source includes one or more red LEDs 402 and one or more blue LEDs 404. The example luminaire 401 includes a second light source, in this case providing green light. The example second source for green light includes an infrared (IR) laser emitter such as a laser diode 416 and a second harmonic device 418 as an example of the light frequency up-converter to convert the infrared beam, in this example, to the green light. Alternatively, the combination of the laser diode and up-converter could be configured to provide yellow light. For green or yellow light, the laser diode and up-converter may be implemented in any of the various ways discussed above relative to FIGS. 1 to 3.

The example luminaire 401 includes a housing 414. The housing 414 may have any particular structure and/or aesthetic design that is suitable to an intended installation location, intended mounting, or illumination application specifications. Luminaire 401 also includes a reflector 410 and a diffuser 412 optically coupled to the output of the light sources. The reflector 410 and the diffuser 412 are examples of a elements of a secondary optic as was discussed above relative to optic 14 in FIG. 1. The reflector 410 and the diffuser 412 may at least partially enclose the light sources, as illustrated by way of example in FIG. 4. The reflector 410 and the diffuser 412 distribute the light from the sources in a volume or on a surface area intended for illumination, in accordance with a distribution specification for the particular luminaire configuration. A wide variety of materials and structures may be used to implement the reflector 410 and the diffuser 412. The location and optical relationship of the reflector 410 and the diffuser 412 relative to the sources and to each other are shown by way of non-limiting examples only; and it should be apparent that other arrangements may be suitable to particular artificial illumination applications. Also, depending on the particular general illumination application of a luminaire 401 and/or the aesthetics of the luminaire design, one or both of the reflector 410 and the diffuser 412 may be omitted.

The example assumes a relatively 'smart' luminaire implementation having communication capability for control of the general illumination capabilities of the example luminaire 401, similar to the system 1 of FIG. 1. Hence, although the electrical components such as the driver(s) and controller are omitted, the example luminaire 401 of FIG. 4 includes an access area 406 for wired communication connectors, such as RJ45 connectors 408, and/or for circuitry such as the driver(s) and/or the controller. If the luminaire incorporates wireless communication capability, connectors 408 and the access area 406 may be omitted. Power connections to AC mains or to DC lines to a separately located driver or drivers may also be provided in the access area 406 or elsewhere on the luminaire 401.

For generating green light, the example luminaire 401 includes at least one infrared laser diode 416 and a second ($2^{nd}$) harmonic type light frequency up-converter 418 coupled to receive the beam from the laser diode type emitter 416. The light frequency up-converter 418 is configured to convert the infrared laser light to green light, of dominant wavelength (and possibly spectral power distribution) suitable for combination with red and blue light from the LEDs 402, 404, for example, to provide tunable general illumination. Although shown by way of example as a second ($2^{nd}$) harmonic device 418, the light frequency up-converter in the luminaire 401 may be formed like any of the light frequency up-converters discussed above relative to the examples of FIGS. 1 to 3.

The luminaire 401 has an optic 420 coupled to the output of the light frequency second harmonic device 418, serving as an optical distribution element for dispersing the green light. The optic 420 may be a diffuser, a lens or a holographic splitter or diffuser. The optic 420 disperses the green light for combination with the red and blue light for output from the luminaire 401 via the secondary optic formed by the reflector 410 and the diffuser 412.

FIG. 5 is a plan view of several elements of the luminaire 401 of FIG. 4, albeit with a somewhat different layout of the LEDs 402, 404 as well as the infrared (IR) laser emitter 416 and the second harmonic device 418 serving as the light frequency up-converter. Also, the example of FIG. 5 uses an optical waveguide 420a as the dispersal optic. The LEDs 402, 404 operate as in the example of FIG. 4. The IR laser emitter 416 and the second harmonic device 418 produce a beam of green light as in the example of FIG. 4. In the implementation of FIG. 5, however, the beam of green light is introduced into one end of the elongated optical waveguide 420a.

In general, light waveguides, also sometimes referred to as "light guides" or "light pipes," are known in the lighting arts. A light waveguide utilizes internal reflections governed by Snell's Law. In this example, the light waveguide also is configured to provide a dispersed light output for general illumination. The light waveguide may be cylindrical or have a square or other rectangular cross-section. Such a rectangular cross-section example of the light waveguide 420a may be fabricated of a clear light transmissive material, such as clear plastic or glass or acrylic, having opposing longitudinal surfaces between which the light is internally guided. The opposing longitudinal surfaces may be flat or curved. As shown in FIG. 5, the light transmissive waveguide 420a has a longitudinal, light output surface 421, which may be treated to diffuse light or may have an associated diffuser (not shown). The waveguide 420a also has an opposing longitudinal surface (not visible in the drawing) opposite the output surface 421.

Generally, the waveguide body also includes one or more lateral surfaces through which light can be introduced into the guide from one or more light sources coupled to the lateral or 'edge' surface(s). In the example of FIG. 5, the second harmonic device 418 is coupled to one such lateral/edge surface to introduce the green light beam into the waveguide 420a. Because of the high angle of incidence (angle from an axis perpendicular to the respective surface) of light rays at the longitudinal surfaces of the waveguide body, the light rays will internally reflect off of these surfaces and consequently will not escape the waveguide 420a. In this way, the internal reflections, at longitudinal surfaces of the guide structure, channel or guide light introduced at one or more lateral or peripheral surfaces along the body of the waveguide 420a, often without emerging from the guide's longitudinal surfaces except at desired specially configured output locations.

Light rays hitting a longitudinal surface at an angle of incidence less than the critical angle pass through the surface. In a pure waveguide arrangement, light introduced into the waveguide on or about a line between and essentially parallel to the longitudinal surfaces of the waveguide may reflect one or more times and remain within the waveguide across the entire longitudinal extent of the waveguide (right to left in the example orientation of FIG. 5). If the opposite lateral surface of the waveguide also is reflective, light is reflected back and repeats the TIR channeling back in the opposite direction. For lighting applications or the like, features therefore are provided along one or both longitudinal surfaces that change the reflective characteristic of the surface and the critical angle; and/or features provided along one or both longitudinal surfaces may change the angle of light reflection within the waveguide and thus change the next angle of incidence of a light ray on a longitudinal surface intended as an output surface.

Hence, extraction of the green illumination light from the waveguide 420a can be achieved by providing an optical mechanism for changing the manner in which the light rays pass through or reflect off one or the other of the longitudinal surfaces of the light waveguide. In the example of FIG. 5, light extraction features may be located along the longitudinal surface opposing the output surface 421, to direct light toward the light output surface 421 at angles that will not be reflected at the output surface 421 and thus allow emission of light through surface 421 without further total internal reflection within the light transmissive waveguide 420a. The features 7 might also let the light pass through/refract out of the opposing surface and onto a reflective covering and then proceed to pass back through the waveguide body and out of the output surface 421.

An example of extraction features may use diffuse reflection at the opposite surface. In such an extraction example, the opposing surface of the light waveguide 420a may have a layer of a light diffusing reflective material, which is bonded to this surface. For example, the bonded surface can be provided in the form of highly reflective diffuse paint, or a separate diffuse reflector element bonded to the surface by an optical adhesive having a reflective index that substantially matches the reflective index of the light waveguide 420a. Alternatively, the opposing surface may be treated to reduce internal reflectivity of the surface itself. The diffusely reflective layer changes the nature of the reflections at or from the opposing surface. The reflections are now diffuse in nature resulting in reflected light being scattered toward the output surface 421 of the light waveguide 420a so as to increase the amount of light that strikes the output surface 421 at low angles of incidence (closer to the perpendicular). The low-angle incident light emerges from the output surface 421, which will cause the surface 421 to illuminate and exhibit brightness. Any component of diffused light coming off diffusely reflective material at high angles of incidence will continue to be piped down the waveguide 420a for later diffusion and emission. Other extraction techniques may be used. For example, extraction features could be frit produced by etching or the like, prismatic features, lens structures formed in or coupled to the output surface 421 of the waveguide 420a.

In any of these extraction feature implementations, the features may be uniformly distributed across the respective surface or along the bulk material body of the waveguide 420a, to provide a uniform light output distribution, in this case for output of the green light from the source formed by the IR laser diode 416 and the second harmonic device 418. Alternatively, the extraction features may be non-uniformly distributed, for example, to provide lower light output per unit of output surface area in regions near corners of the waveguide 420a.

In the various implementations of the light waveguide 420a outlined above, the green light output is distributed across the area of the output surface 421, and the light processing by the surfaces and features of the waveguide 420a tend to make that green light output rather diffuse. In the far field, the green light would mix with the red light from diodes 402 and the blue light from diodes 404. If provided as part of a secondary optic, a diffuser 412 may further mix the red, green and blue light.

The luminaire example 401 of FIG. 5 utilized the light waveguide 420a to distribute the green or yellow light from the second harmonic type upconverter 418; and the other light emitters 402, 404 emitted light for distribution via the secondary optic formed by the reflector 410 and the diffuser 412. An alternative luminaire configuration would utilize a light waveguide for optical processing of the red, blue or other color light from LED type emitters like 402, 404 as well as the green or yellow light from a second harmonic type upconverter similar to the upconverter 418. The LEDs and the upconverter would be coupled to input light to the waveguide via one or more perimeter surfaces or 'edges' of the waveguide, and the 'edge lit' waveguide would emit combined light via a light output surface, in a manner similar to the optical processing and output of green or yellow light by the waveguide 420a described above.

The luminaire examples of FIGS. 4 and 5 utilized LEDs as the solid state emitters for the red and blue light. The green or yellow light generation technology, however, may be combined with other solid state sources of the other light colors. For example, luminaires may utilize additional laser diodes to produces red, blue or other color light for combination with the green or yellow light from the infrared laser and light frequency up-converter. For that purpose, the additional laser sources could be infrared devices for use with up-converters to produce the red and blue light. Much like red and blue LEDs, however, the efficiency of red and blue laser diodes is reasonably high and adequate to allow use of red and blue laser diodes as the actual red and blue emitters in luminaires for artificial general lighting.

A few examples of luminaires using a green or yellow light source similar to any of the above described examples in combination with red and blue laser diodes are described with respect to FIGS. 6 to 8. In those luminaire examples, green or yellow light may be produced by any combination of a laser emitter and light frequency up-converter discussed above relative to FIGS. 1 to 3. For convenience, the drawings and discussions of FIGS. 6 to 8 primarily refer to producing green light via an infrared laser diode and appropriate light frequency up-converter.

FIG. 6 is a cross-sectional view of a first example of such a luminaire 601, which uses a red laser diode 602 and a blue laser diode 604 in combination with a light source formed by an infrared laser diode 606 and a second harmonic type light frequency up-converter 608 to convert the infrared beam to green light. The luminaire 601 also includes two beam combiners 612, 614. Both beam combiners 612, 614 pass green light received in one direction (e.g. horizontally received from the right in the illustrated orientation). Each of the beam combiners 612, 614 receives light of a particular color range from another direction and reflects light of that color along the same output path along which the combiners pass the green light. The combiners 612, 614 may be dichroic reflectors with appropriate color filter characteristics and having transmissivity versus reflectivity with respect to the light received in the two different input directions.

The first beam combiner 612 passes green light received on one input, from the up-converter 608 in the example. That beam combiner 612 reflects blue light received on its other input, from the blue laser diode 604. The reflection by beam combiner 612 directs the blue light along the same output path as the green light beam (e.g. horizontally to the left in the illustrated orientation). In this way, the first beam combiner 612 forms one or more beams 613 of green (G) and blue (B) light, for input to the second beam combiner 614.

The second beam combiner 614 passes green and blue light received as beam(s) 613 on one input, from the first combiner 612 in the example. The second beam combiner 614 reflects red light received on its other input, from the red laser diode 60. The reflection by beam combiner 614 directs the red light along the same output path as the green and blue light beams (e.g. horizontally to the left in the illustrated orientation). In this way, the second beam combiner 614 forms one or more beams 616 of red (R), green (G) and blue (B) light.

The luminaire 601 also includes a distribution optic 618. The output of the combiner 614 directs the resultant RGB light beam(s) 616 to the distribution optic 618. The distribution optic 618, for example, may be a diffuser, a lens or a holographic splitter or diffuser. The optic 618 disperses the red (R), green (G) and blue (B) light over an angular region intended for illumination of a space by the light output from the luminaire 601. With a suitable distribution optic 618, the luminaire 601 may serve as a spotlight or circular downlight.

The example luminaire 610 utilized three beams from three sources, and the specific colors were RGB. It should be apparent that other laser sources/light colors may be used in a luminaire similar to 610, instead of or in addition to those shown the example of FIG. 6. For example, the laser diode 606 and second harmonic type up-converter 608 for green light could be replaced with a laser diode and up-converter combination that produces yellow. As another example, if addition of yellow together with the red, green, blue light was desirable for a particular application, the luminaire might include a further combiner to pass one of the beams and reflect yellow light for addition to the beams. In such an alternative, the yellow light source would be an appropriate combination of an infrared laser diode and up-converter. Also, one or both of the diodes 602, 604 may be replaced with lasers of other visible colors, and/or the luminaire might include an additional combiner and laser diode (without an up-converter) of another visible color.

The luminaire configuration of FIG. 6 utilizing two or more beam combiner provides a tight beam of combined laser light for precise distribution, for example, by a holographic diffuser or the like serving as the distribution optic 618. That arrangement, however, requires fairly consistent and accurate alignment of the laser diodes, up-converter and the beam combiners. For some applications, where the precise distribution is not required, it may be more cost effective to utilize arrangements of the lasers without alignment and with more conventional distributions optics.

For example, FIG. 7 is a cross-sectional view of another luminaire 701 in which the laser sources need not be precisely aligned. Similar to the previous example, however, the luminaire 701 uses laser sources of three different colors. Although other colors could be used instead of or in addition to those shown, the drawing shows an implementation of luminaire 701 that includes a red laser diode 702 and a blue laser diode 704. Although the second source could provide green or yellow light as in earlier examples, the specific example shows a source of green light formed by an infrared laser diode 706 and a second harmonic type light frequency up-converter 708. Much like the laser based luminaire of FIG. 6, the luminaire 701 may utilize other laser sources/light instead of or in addition to the laser diode and up-converter combination to produce green light and/or the red and blue laser diodes shown the example of FIG. 7.

The luminaire 701 includes an optic 718. In the example, this optic 718 mixes the different color lights and distributes the combined light as the output of the luminaire 701. The drawing shows the red beam from the laser diode 702, the blue beam from the laser diode 704 and the green beam from the combination of the diode 706 and up-converter 708 emitted generally parallel to each other toward the planar input surface of the optic 718, although other arrangements/angles may be used. The beams, however, need not be precisely aimed. The drawing shows an example of a single transmissive optic, e.g. a plano-convex lens. Of course, other transmissive or reflective optics or combinations thereof may be used to impellent the mixing and distribution optic 718.

FIG. 8 is a cross-sectional view of another example 801 of a luminaire in which sources of three different colors of light utilize laser light emitter. Similar to the two preceding examples, the luminaire 801 uses laser sources of three different colors. Although other colors could be used instead of or in addition to those shown, the drawing shows an implementation of luminaire 801 that includes a red laser diode 802 and a blue laser diode 804. Although the second source could provide green or yellow light as in earlier examples, the specific example shows a source of green light formed by an infrared laser diode 806 and a second harmonic type light frequency up-converter 808. Much like the laser based luminaire of FIG. 6, the luminaire 801 may utilize other laser sources/light instead of or in addition to the laser diode and up-converter combination to produce green light and/or the red and blue laser diodes shown the example of FIG. 8.

The luminaire 801 includes an optic 818, configured to distribute combined light as the output of the luminaire 801 over an angular region of intended for illumination by the luminaire 801. Again, the red beam from the laser diode 802, the blue beam from the laser diode 804 and the green beam from the combination of the diode 806 and up-converter 808 are emitted generally parallel to each other. The luminaire 801, however, includes a mixer 820 between the sources and the optic 818. Although other optical mixers could be used, the luminaire 801 utilizes an optical waveguide as the mixer 820. The waveguide in this example is configured to receive the colored light beams at one end surface and emit combined light to the optic 818 via an opposite end surface of the waveguide mixer 820. Internally, along its length (longitudinally between the light sources and the optic 818 in the illustration) the surface(s) of the optical waveguide is/are reflective. Such internal reflection may be provided by a light transmissive material with polished surface(s) for total internal reflection. The waveguide, for example may be an optical fiber or a sheet of internally reflective material. The internal reflection may be enhanced with an appropriate cladding of the exterior of the reflective longitudinal surface(s).

Along its length, light hitting the reflective interface at a reflective longitudinal surface is reflected back within the waveguide mixer 820. Photons hitting and reflected off of the surface(s) at different distances from the sources will have different angles of incidence and reflection and tend to mix within the waveguide. Curving the waveguide as shown in the drawing increases the number of reflections and the diversity of angles of reflection along the length of the waveguide. The increase in angular diversity increases the mixing. Mixing may also be increased by increasing the length of the waveguide mixer 820 and/or by adding diffusions features (e.g. frit or roughening) along the internally reflective surfaces.

The waveguide mixer 820 outputs combined red, green and glue light to the input of the distribution optic 818. The optic 818 distributes the combined light over an intended field of illumination for the proposed artificial lighting application of the luminaire 801, for example, as a spotlight or narrow angle downlight. Different forms of the optic 818 and/or the use of waveguides of different shapes, can provide combined light output distributed over different intended fields of illumination.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like, whether or not qualified by a term of degree (e.g. approximate, substantially or about), may vary by as much as ±10% from the recited amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A luminaire, comprising:
    a first light source including one or more solid state emitters, configured to emit light of dominant wavelengths in two separate wavelength ranges of a visible spectrum;
    a second light source configured to emit green or yellow light in a third wavelength range between the two separate wavelength ranges of the visible spectrum, wherein the second light source comprises:
        a solid state laser emitter configured to emit laser light having a dominant wavelength in an infrared range, and
        a light frequency up-converter including a nonlinear metamaterial, coupled to convert the laser light emitted by the solid state laser emitter to green or yellow light having a dominant wavelength in the third wavelength range, wherein the nonlinear metamaterial is a type of metamaterial configured to exhibit:
            resonance for an infrared frequency of the laser light in the infrared range from the solid state laser emitter and resonance for a harmonic frequency of the green or yellow light of a second or higher order harmonic,
            substantial mode overlap between the infrared frequency of the laser light in the infrared range from the solid state laser emitter and the harmonic frequency of the green or yellow light of the second or higher order harmonic, and
            intrinsic nonlinear material or phase matching; and
    the luminaire having a secondary optic that includes a diffuser optically coupled to the first light source and the light frequency up-converter to emit a combined light output of a combination of light in the two separate wavelength ranges from the first light source and the green or yellow light from the light frequency up-converter to distribute the combination of light from the first light source and the light frequency up-converter for artificial illumination lighting of a space.

2. The luminaire of claim 1, wherein:
    the first light source is further configured to emit the light of dominant wavelengths in the two separate wavelength ranges of the visible spectrum over a first spatial distribution for a spotlight or a downlight illumination application of the space; and
    the luminaire further comprises an optical element optically coupled between to the light frequency up-converter and the diffuser to emit the green or yellow light in the third wavelength range over a second spatial distribution substantially the same as the first spatial distribution for the spotlight or the downlight illumination application.

3. The luminaire of claim 2, wherein the optical element comprises a beam shaping lens configured to disperse the green or yellow light from the light frequency up-converter.

4. The luminaire of claim 2, wherein the optical element comprises a hologram configured to split or disperse the green or yellow light from the light frequency up-converter.

5. The luminaire of claim 1, wherein:
the light frequency up-converter is a second order harmonic device configured for approximate frequency doubling in response to the light from the solid state laser emitter;
the dominant wavelength in the infrared range of the light emitted by the solid state laser emitter is a wavelength between about 990 nm and about 1,200 nm; and
the dominant wavelength of the green or yellow light from the second order harmonic device has a dominant wavelength in a range of about 495 nm to about 600 nm.

6. The luminaire of claim 5, wherein:
the dominant wavelength in the infrared range of the light emitted by the solid state laser emitter is a wavelength between about 1,000 nm and about 1,180 nm; and
the dominant wavelength of the green or yellow light from the second order harmonic device has a dominant wavelength in a range of about 500 nm to about 590 nm.

7. The luminaire of claim 1, wherein the light frequency up-converter comprises a harmonic generator configured to convert the laser light to a second, third or higher order harmonic light having the dominant wavelength in the green or yellow range of the visible spectrum.

8. The luminaire of claim 1, wherein the nonlinear metamaterial comprises: a gold split resonator structure; a gold cross bar structure; or an all dielectric cylinder structure.

9. The luminaire of claim 1, wherein the nonlinear metamaterial is a topological metamaterial.

10. The luminaire of claim 1, wherein the light frequency up-converter comprises:
an additional solid state laser emitter configured to emit laser light having a dominant wavelength in the infrared range of the spectrum; and
an optical mixer coupled to receive and mix light from the solid state laser light emitters to produce the green or yellow light having the dominant wavelength in the third wavelength range.

11. The luminaire of claim 10, wherein the optical mixer comprises a nonlinear crystal or a nonlinear metamaterial.

12. The luminaire of claim 1, wherein the solid state emitters of the first light source include at least one red light emitting diode and at least one blue light emitting diode.

13. The luminaire of claim 1, wherein the solid state emitters of the first light source include at least one red light emitting laser diode or at least one blue light emitting laser diode.

14. The luminaire of claim 1, in combination with adjustable driver circuitry for supplying individually controllable currents to first and second light sources for adjustment of a color characteristic of the combination of light emitted from the output of the luminaire.

15. The luminaire of claim 1, wherein:
the two separate wavelength ranges of the visible spectrum include:
a blue wavelength range of approximately 380 nanometers (nm) to 495 nm, and
a red wavelength range of approximately 600 nm to 750 nm; and
the solid state emitters of the first light source include:
a blue solid state emitter that emits blue light in the blue wavelength range, and
a red solid state emitter that emits red light in the red wavelength range.

16. The luminaire of claim 1, wherein:
the solid state emitters of the first light source include a light emitting diode or a laser emitter.

* * * * *